(12) United States Patent
Kim et al.

(10) Patent No.: US 7,483,276 B2
(45) Date of Patent: Jan. 27, 2009

(54) SEMICONDUCTOR PACKAGE AND METHOD FOR MANUFACTURING SAME

(75) Inventors: Hong-Kweun Kim, Ansan-si (KR); Ho-Seong Seo, Suwon-si (KR); Seok-Myong Kang, Hwaseong-si (KR); Youn-Kyoung Gil, Hwaseong-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 36 days.

(21) Appl. No.: 11/471,385

(22) Filed: Jun. 20, 2006

(65) Prior Publication Data

US 2007/0139900 A1    Jun. 21, 2007

(30) Foreign Application Priority Data

Dec. 21, 2005    (KR) ............... 10-2005-0127069

(51) Int. Cl.
  *H05K 7/02*    (2006.01)
  *H05K 7/06*    (2006.01)
  *H05K 7/08*    (2006.01)
  *H05K 7/10*    (2006.01)

(52) U.S. Cl. ................ 361/760; 361/790; 361/803

(58) Field of Classification Search ........ 361/600, 361/679, 748, 760, 811, 820, 790, 803; 174/250, 174/255, 260; 257/678, 390, 691, 692; 29/592

See application file for complete search history.

(56) References Cited

U.S. PATENT DOCUMENTS

| | | | | |
|---|---|---|---|---|
| 5,357,674 A * | 10/1994 | Lumbard | .................. | 29/843 |
| 5,646,828 A * | 7/1997 | Degani et al. | ............... | 361/715 |
| 6,324,067 B1 * | 11/2001 | Nishiyama | .................. | 361/761 |
| 6,807,061 B1 * | 10/2004 | Harris | .................. | 361/719 |
| 6,847,529 B2 * | 1/2005 | Dibene, II et al. | ............ | 361/803 |
| 6,888,235 B2 * | 5/2005 | Lopata et al. | ............... | 257/691 |
| 7,101,731 B2 * | 9/2006 | Karnezos | ................... | 438/107 |
| 2002/0117330 A1 * | 8/2002 | Eldridge et al. | ............ | 174/260 |
| 2003/0034564 A1 * | 2/2003 | Palanisamy et al. | ........ | 257/778 |
| 2004/0135246 A1 * | 7/2004 | Kim et al. | ................... | 257/712 |
| 2005/0018407 A1 * | 1/2005 | Harris | ........................ | 361/719 |
| 2005/0046040 A1 * | 3/2005 | Wang et al. | ................. | 257/778 |

* cited by examiner

*Primary Examiner*—Tuan T Dinh
(74) *Attorney, Agent, or Firm*—Cha & Reiter, LLC

(57) ABSTRACT

Disclosed is a semiconductor package adapted to be light, slim, compact, and suitable for high-density mounting and a method for manufacturing the same. The semiconductor package includes a semiconductor chip; a plurality of active/passive devices; a first PCB acting as a main board, the semiconductor chip and devices selected from the plurality of active/passive devices being mounted on the first PCB, the devices including a highest device; and at least one sub-PCB, remaining devices of the plurality of active/passive devices being mounted on the sub-PCB, the sub-PCB having a through-hole, at least the highest device on the first PCB extending through the through-hole, so that the sub-PCB is connected to the first PCB and positioned in a space above the first PCB while overlapping the first PCB.

15 Claims, 10 Drawing Sheets

SEMICONDUCTOR PACKAGE AND METHOD FOR MANUFACTURING SAME

CLAIM OF PRIORITY

This application claims the benefit of the earlier filing data, pursuant to 35 USC 119, to that patent application entitled "Semiconductor Package and Method for Manufacturing the Same," filed with the Korean Intellectual Property Office on Dec. 21, 2005 and assigned Serial No. 2005-127069, the contents of which are hereby incorporated by reference.

BACKGROUND OF THE INVENTION

1. Field of the Invention

The present invention relates to a semiconductor packaging fabricated by mounting semiconductor chips and active or passive devices on a PCB, and more particularly to a semiconductor package adapted by mounting semiconductor chips and active or passive devices on a PCB and a method for manufacturing the same.

2. Description of the Related Art

Pursuant to the trend towards compactness and high-integration of portable devices, for example, it is increasingly requested that components be fabricated in more compact size. In order to meet such a request, various types of packages have been developed.

FIG. 1 shows the structure of a conventional semiconductor package. In the drawing, reference numeral 100 refers to a PCB, 1 represents an input/output pad, 2 represents a bonding wire, 3 represents a liquid molding resin, 4 represents a dam, 10-30 represent active devices, 40-90 represents passive devices, and 110 represents a semiconductor chip.

As shown in FIG. 1, the conventional package is designed in such a manner that the active and passive devices are mounted in the same plane of the PCB 100 (i.e. in a two-dimensional space). This means that, depending on the thickness of devices mounted thereon, the package has a space A, which includes unused space referred to as idle space. As a result, the size of the package shown in FIG. 1 is greater than required to handle the components, as the idle space can be a significant portion of the package volume.

SUMMARY OF THE INVENTION

Accordingly, the present invention has been made to solve the above-mentioned problems occurring in the prior art and provides additional advantages, by providing a semiconductor package having internal devices positioned stereoscopically so that idle space is minimized and the package is light, slim, compact, and suitable for high-density mounting.

One aspect of the present invention is to provide a method for manufacturing a semiconductor package wherein internal devices of the package are positioned stereoscopically so that idle space is utilized and the package size is minimized.

In one embodiment, there is provided a semiconductor package including a semiconductor chip, a plurality of active/passive devices, a first PCB acting as a main board, the semiconductor chip and devices selected from the plurality of active/passive devices being mounted on the first PCB, the devices including a highest device, and at least one sub-PCB, remaining devices of the plurality of active/passive devices being mounted on the sub-PCB, the sub-PCB having a through-hole, at least the highest device on the first PCB extending through the through-hole, so that the sub-PCB is connected to the first PCB and positioned in a space above the first PCB while overlapping the first PCB.

Preferably, the active/passive devices mounted on the sub-PCB are selected so that, after the sub-PCB is connected to the first PCB, a final height of the sub-PCB is not larger than a thickness of the highest device on the first PCB.

Preferably, the sub-PCB includes a second PCB having at least one active/passive device, the second PCB being connected to and positioned on the semiconductor chip, and a third PCB having at least one active/passive device mounted on a surface, an opening for exposing a connection portion between the semiconductor chip and the second PCB, and a through-hole, the highest device on the first PCB extending through the through-hole, the third PCB being positioned so as to overlap the first PCB and the second PCB.

In accordance with another aspect of the present invention, there is provided a method for manufacturing a semiconductor package by mounting a semiconductor package and a plurality of active/passive devices on a PCB, the method including the steps of attaching the semiconductor chip and devices selected from the plurality of active/passive devices to a first PCB, the devices including a highest device, attaching remaining devices of the plurality of active/passive devices to a surface of at least one sub-PCB having a through-hole, at least the highest device on the first PCB extending through the through-hole, and positioning the sub-PCB in a space above the first PCB so that the surface of the sub-PCB, the active/passive devices being mounted on the surface of the sub-PCB, faces a surface of the first PCB, the active/passive devices being mounted on the surface of the first PCB and electrically connecting the sub-PCB to the first PCB.

Preferably, the active/passive devices mounted on the sub-PCB are selected so that a height of the active/passive devices from the first PCB is not larger than a thickness of the highest device on the first PCB.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE INVENTION

Hereinafter, embodiments of the present invention are described with reference to the accompanying drawings. For the purposes of clarity and simplicity, a detailed description of known functions and configurations incorporated herein is omitted as it may make the subject matter of the present invention unclear.

Figure 1:
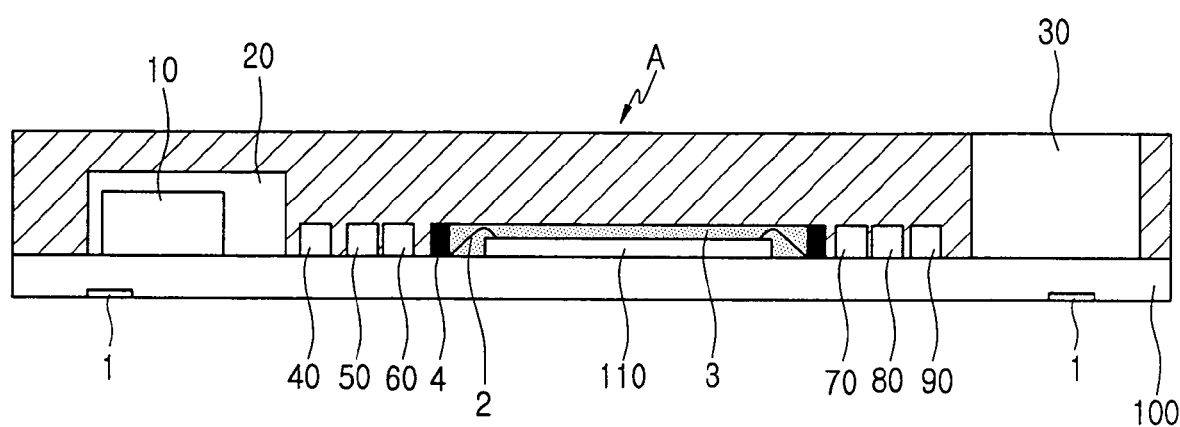
FIG. 1 shows the structure of a conventional semiconductor package.
Figure 2:
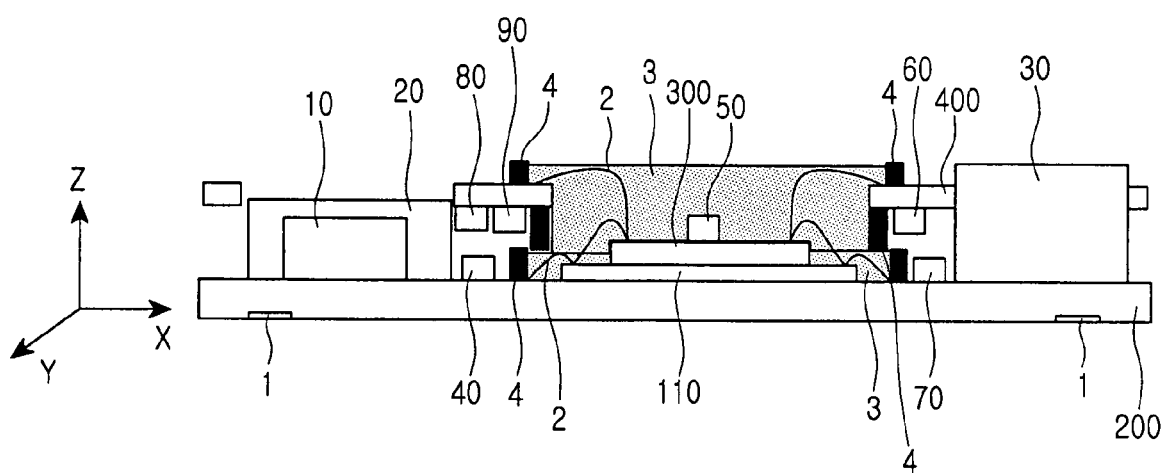
FIG. 2 shows the structure of a semiconductor package according to an embodiment of the present invention.

FIG. 2 shows the structure of a semiconductor package according to an embodiment of the present invention.

Referring to FIG. 2, the semiconductor package according to the present invention includes a first PCB 200, which acts as a main board, and second and third PCBs 300 and 400, respectively, positioned on top of the first PCB 200.

The first PCB 200 accommodates active devices 10-30, passive devices 40 and 70, and a semiconductor chip 110, which have a relatively large size among devices constituting the package.

The second PCB 300 is mounted on the semiconductor chip 110 and has at least one active or passive device. Although the second PCB 300 has a passive device 50 mounted thereon in the present embodiment, the type and number of devices mounted on the second PCB 300 can be varied, as long as the sum of thickness of the underlying semiconductor chip 110, the second PCB 300, and the overlying device 50 does not exceed the thickness of a device 30, which is highest (i.e., measured perpendicularly from PCB 200) among the devices mounted on the first PCB 200.

The third PCB 400 is provided with at least one passive device 60, 80, and 90. The third PCB 400 has openings formed in positions corresponding to the large-size active devices 20 and 30, which are mounted on the first PCB 200, so that the third PCB 400 is positioned in a space defined above the first PCB 200 while spatially overlapping it. Such positioning of the third PCB 400 in the space above the first PCB 200 (Z-axis direction) reduces the area occupied by the package in X-axis direction. In addition, in terms of Y-axis and Z-axis directions, neither the second PCD 300 nor the third PCB 400 exceed the width and height of the device 30, which is largest among the devices of the package, so that no space is additionally occupied in the Y-axis or Z-axis direction. As a result, the area occupied in the X-axis direction can be substantially reduced while maintain the same size in the Y-axis and Z-axis directions.

The first, second, and third PCBs 200, 300, and 400 can be electrically connected to one another by bonding wires 2 and have a portion sealed by a liquid molding resin 3 and a dam 4, in order to protect wire-bonded portions. The first PCB 200 has an input/output pad 1.

A method for manufacturing a semiconductor package according to the present invention, which is constructed as mentioned above, will now be described.

FIGS. 3a to 3h are side views showing steps for realizing the semiconductor package shown in FIG. 2, and FIGS. 4a to 4h are top views corresponding to FIGS. 3a to 3h, respectively.

Figure 3A:
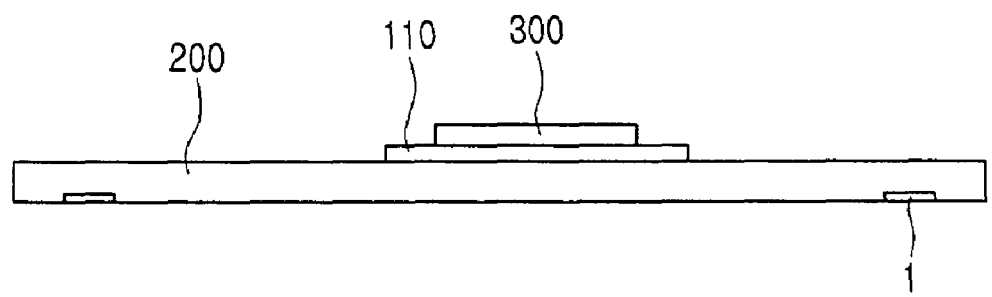
FIGS. 3a to 3h are side views showing steps for realizing the structure shown in FIG. 2.
Figure 4A:
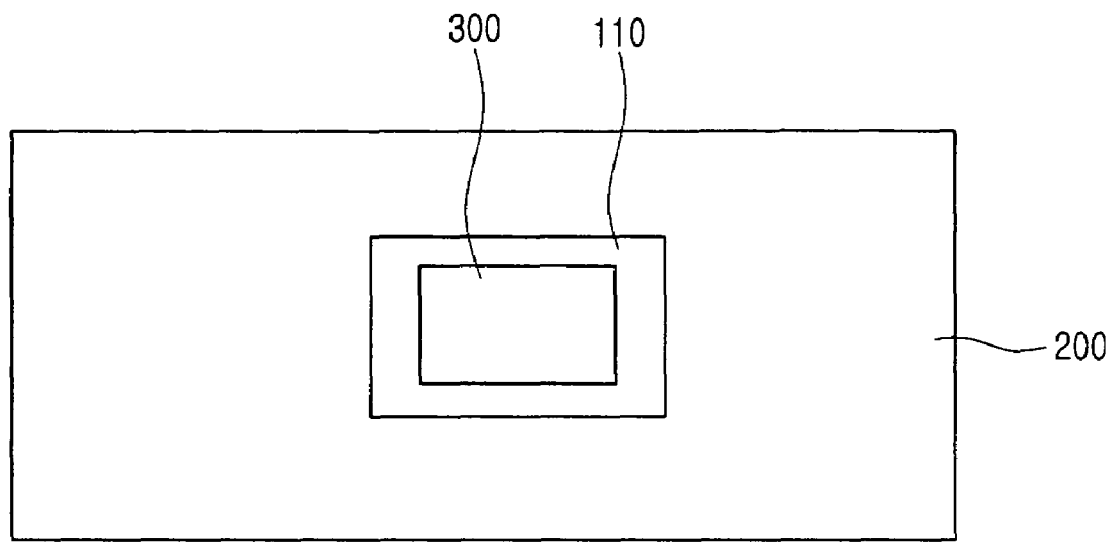
FIGS. 4a to 4h are top views corresponding to FIGS. 3a to 3h, respectively.

Referring to FIGS. 3a and 4a, a semiconductor chip 110 is attached to a first PCB 200, which has an input/output pad 1, and second PCB 300 is attached to the semiconductor chip 110.

Figure 3B:
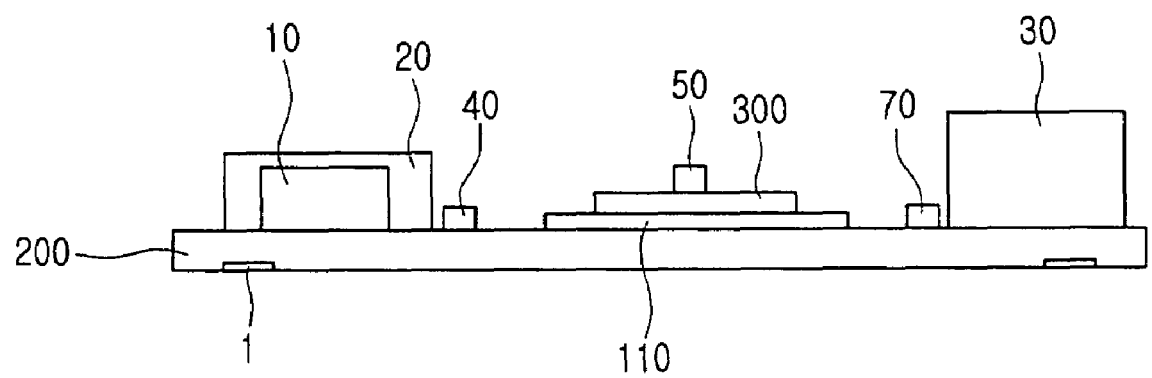
Figure 4B:
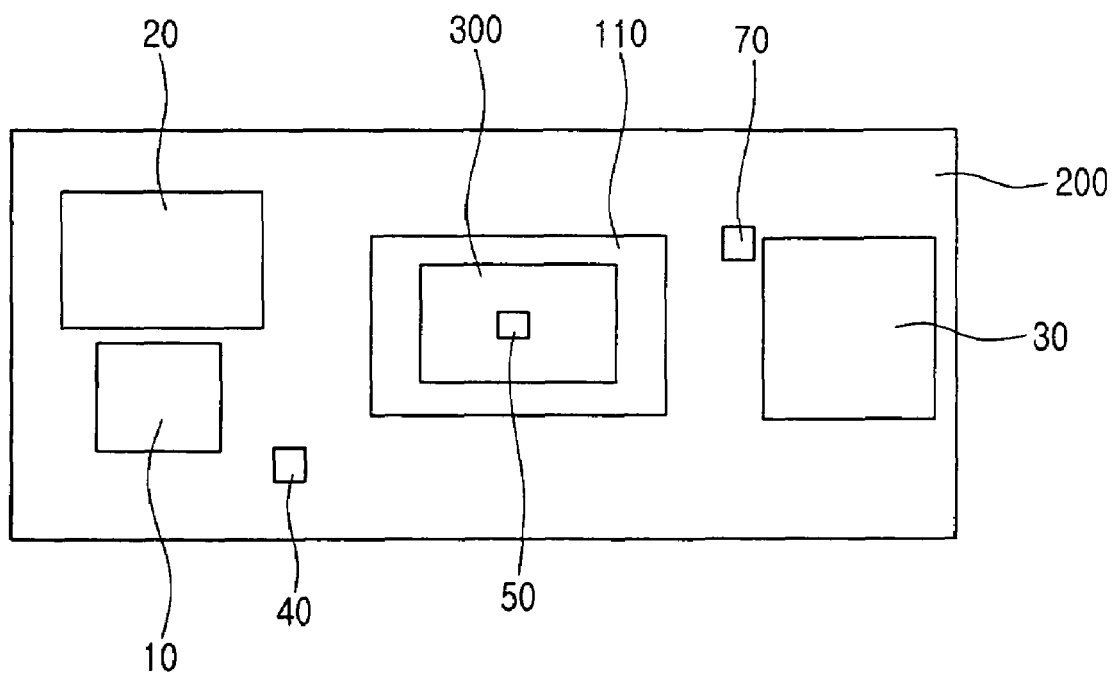

Referring to FIGS. 3b and 4b, solder paste is applied to the top of the first and second PCBs 200 and 300, and an SMT (surface mount technology) process is used to attach active devices 10, 20, and 30 and passive devices 40, 50, and 70. The device 50, which is attached to the top of the second PCB 300, is properly positioned in such a manner that the sum of thickness of the device 50, the second PCB 300, and the semiconductor chip 110 does not exceed the thickness of the device 30, which is highest among the devices mounted on the first PCB 200. Although the second PCB 300 is mounted on top of the semiconductor chip 110 in the present embodiment, the positional relationship is not limited to that shown herein.

Figure 3C:
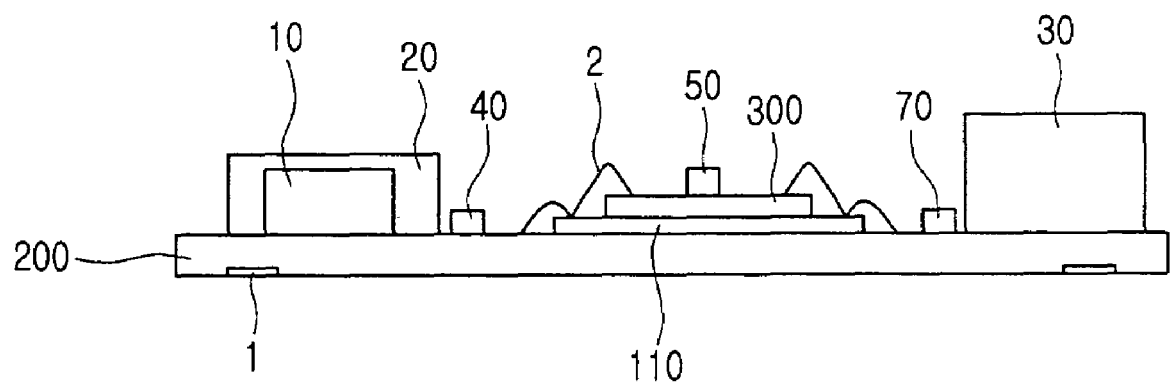
Figure 4C:
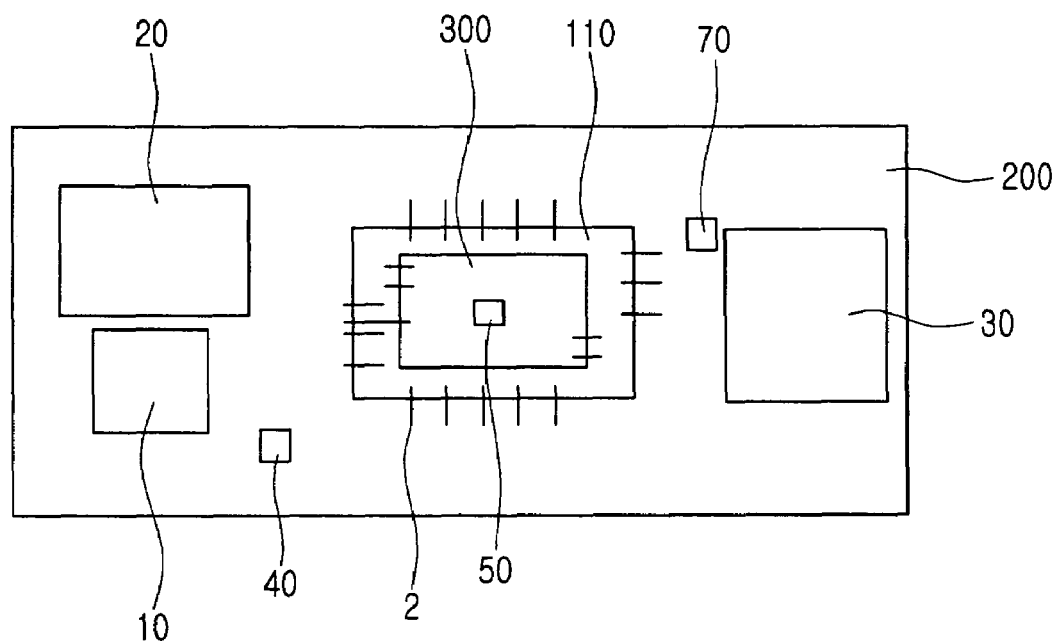

Referring to FIGS. 3c and 4c, a wire bonding process is performed to electrically connect the semiconductor chip 110, the first PCB 200, and the second PCB 300 using metal wires 2.

Figure 3D:
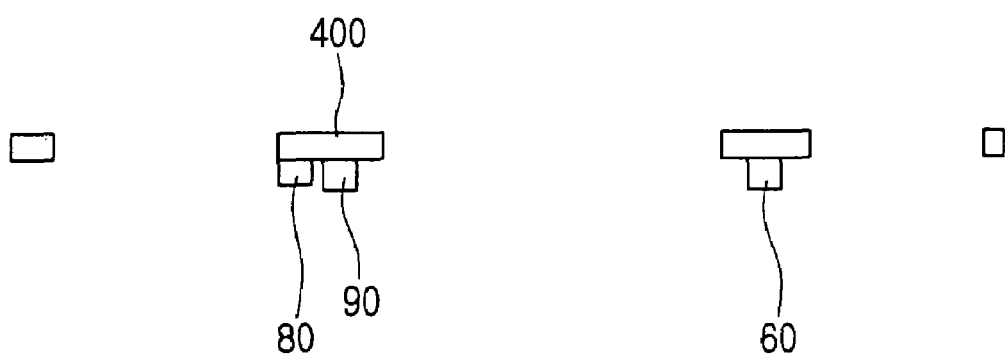
Figure 4D:
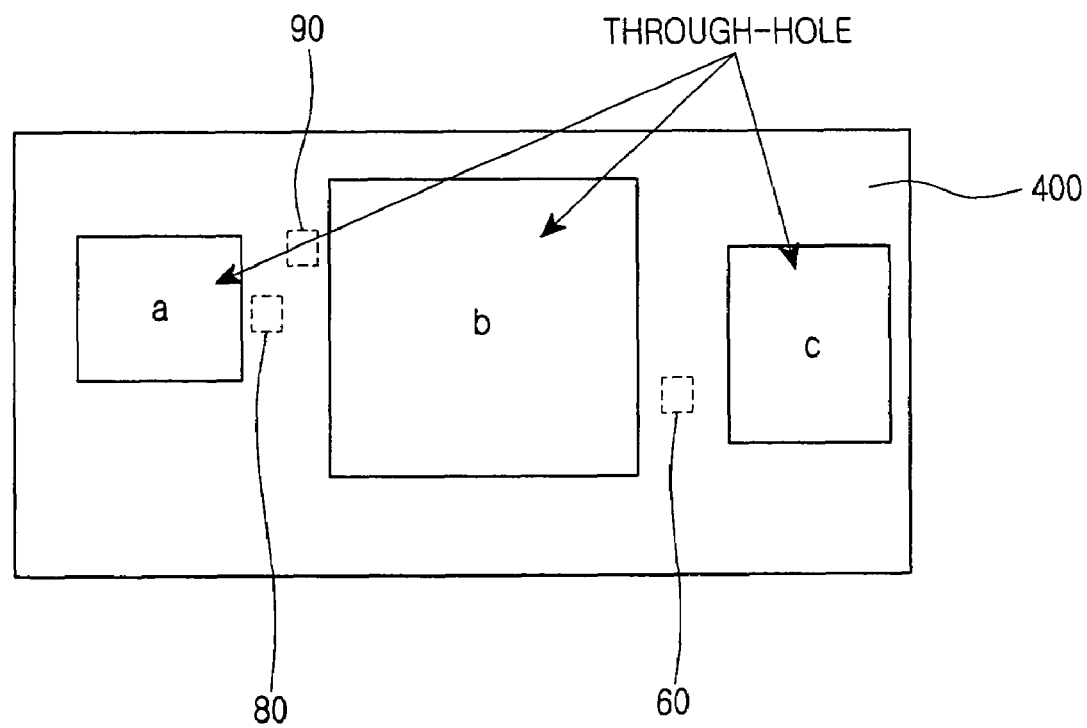

Referring to FIGS. 3d and 4d, a third PCB 400 is prepared so that it has through-holes formed in positions corresponding to thick active devices a and b, as well as in a position corresponding to a wire-bonded portion c of the semiconductor chip, which is connected to the first PCB 200. Passive devices 60, 80, and 90 or thin active devices are attached to the third PCB 400 using an SMT process.

As used herein, expressions "thick" and "thin" are relative concepts and do not limit any specific numeral range. Particularly, when the height of a device exceeds approximately half the overall height of a package, the device is described as "thick."

Figure 3E:
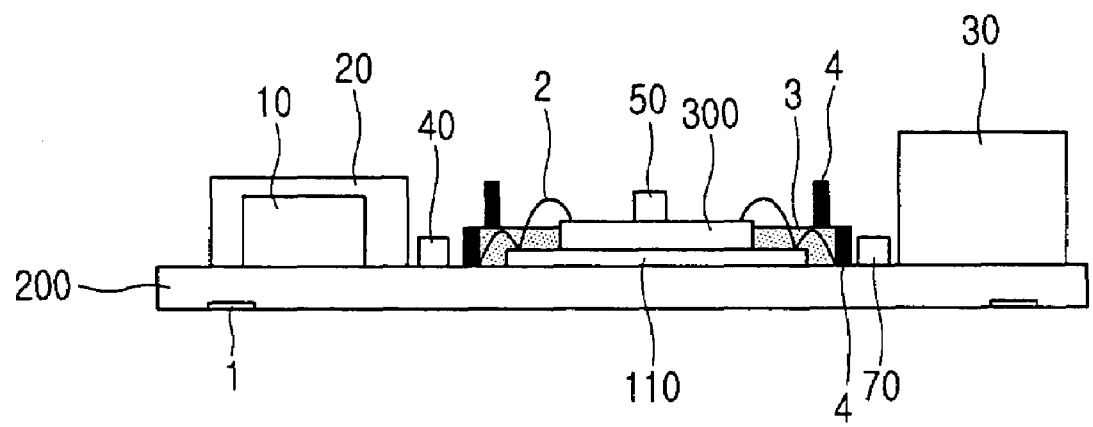
Figure 4E:
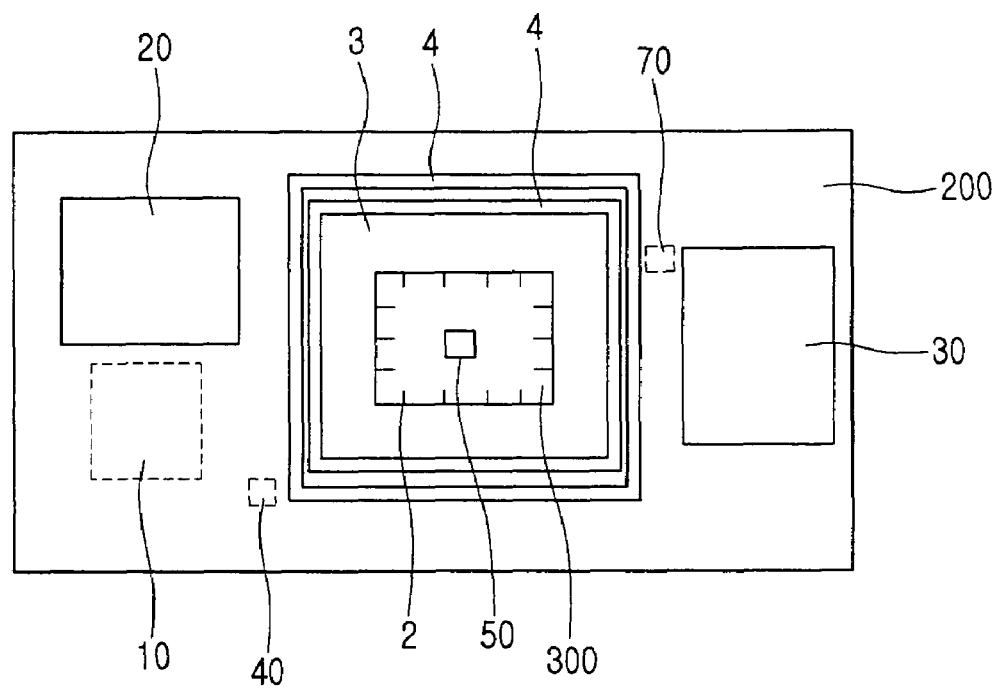

Referring to FIGS. 3e and 4e, wire-bonded portions of devices mounted on the first PCB 200 are sealed by a liquid molding resin 3 for protection. Firstly, wire-bonded portions for connection between the semiconductor chip 110 and the first PCB 200 are sealed by a liquid resin. The height of a pad region of the second PCB 300, which is positioned on top of the semiconductor chip 110, is adjusted so that, for further wire bonding, the region is not covered. After the liquid molding resin is fully cured, a dam 4 is formed so as to bond the third PCB 400. The dam 4 may be made of an insulative liquid resin or an adhesive material, both surfaces of which can be used for adhesion.

Figure 3F:
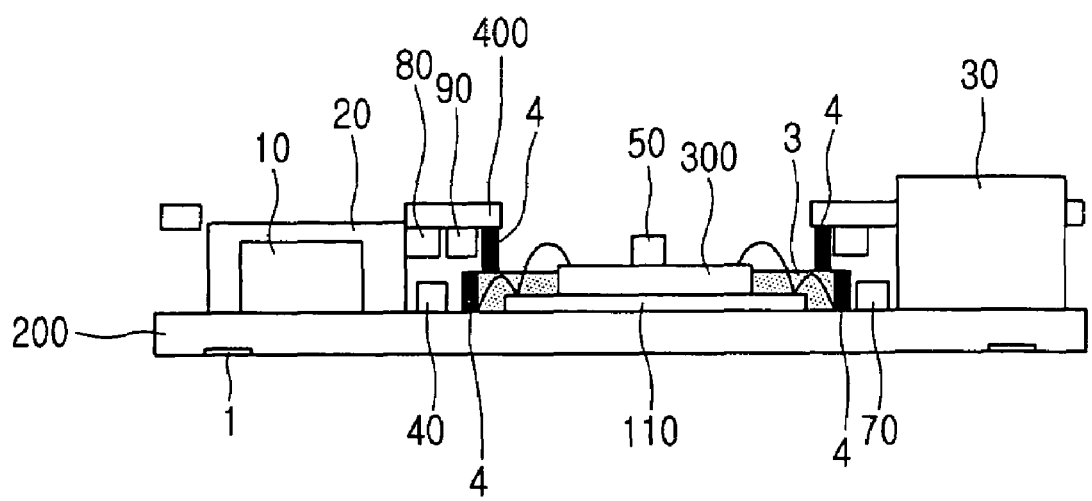
Figure 4F:
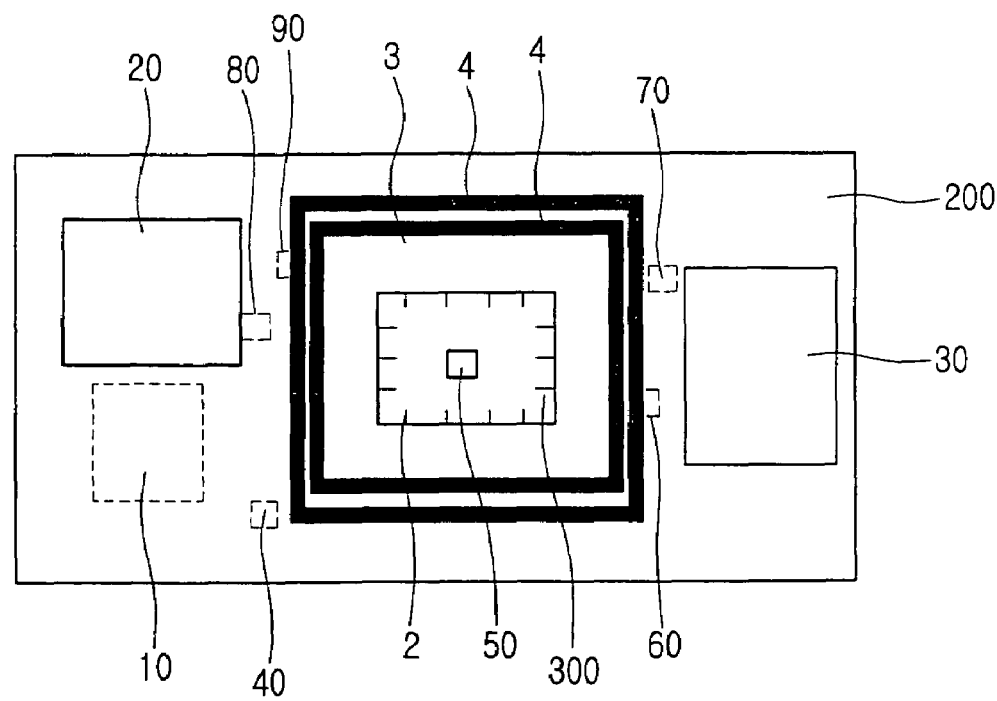

Referring to FIGS. 3f and 4f, the third PCB 400, which has been prepared in the step shown in FIG. 3d, is turned upside down and is attached to the top of the second PCB 300 so that the part of the third PCB 400, on which the devices 60, 80, and 90 are mounted, faces the second PCB 300. The first and third PCBs 200 and 400 are bonded to each other by the dam 4. Before the attachment process, a guide bar may be placed on the periphery of the package so that the devices can be properly aligned for uniform height. Due to the through-holes, the third PCB 400 is stereoscopically positioned (in Z-axis direction) while overlapping the first PCB 200, so that the area occupied by the package in X-axis direction is reduced. In addition, in terms of Y-axis and Z-axis directions, the third PCB 400 does not exceed the width and height of the device 30, which is largest among the devices of the package, so that no space is additionally occupied in the Y-axis or Z-axis direction. As a result, the area occupied in the X-axis direction can be substantially reduced while maintain the same size in the Y-axis and Z-axis directions.

Figure 3G:
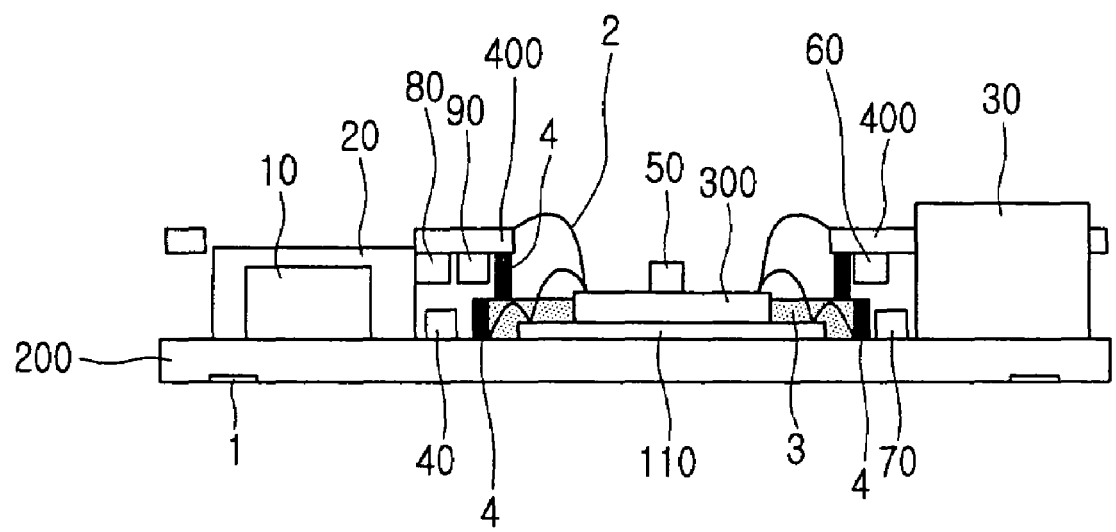
Figure 4G:
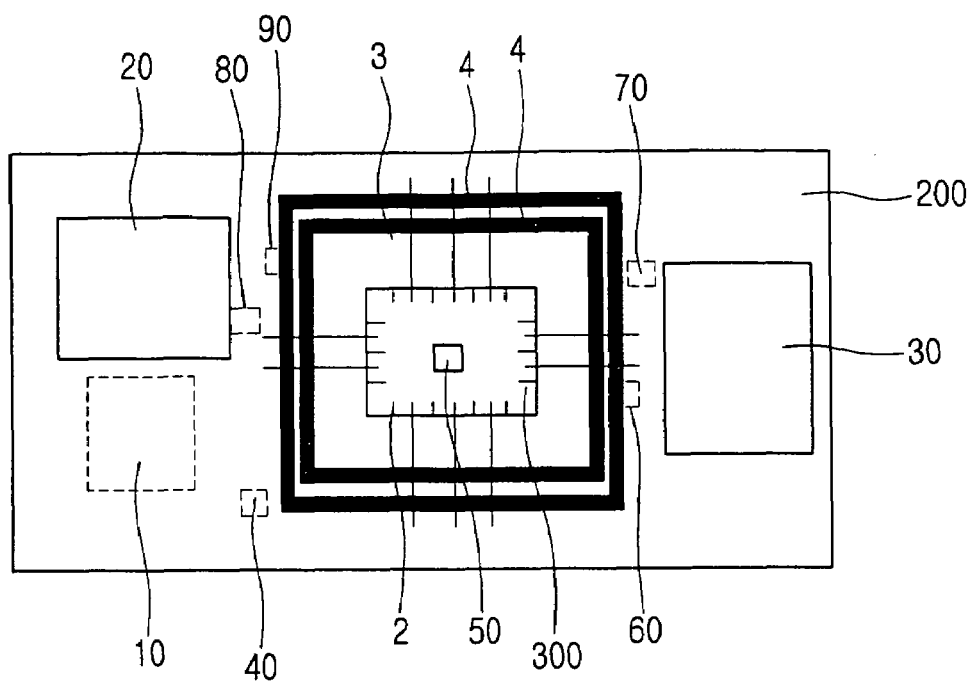

Referring to FIGS. 3g and 4g, after bonding the second and third PCBs 300 and 400, pads between the second and third PCBs 300 and 400 are electrically connected by bonding wires.

Figure 3H:
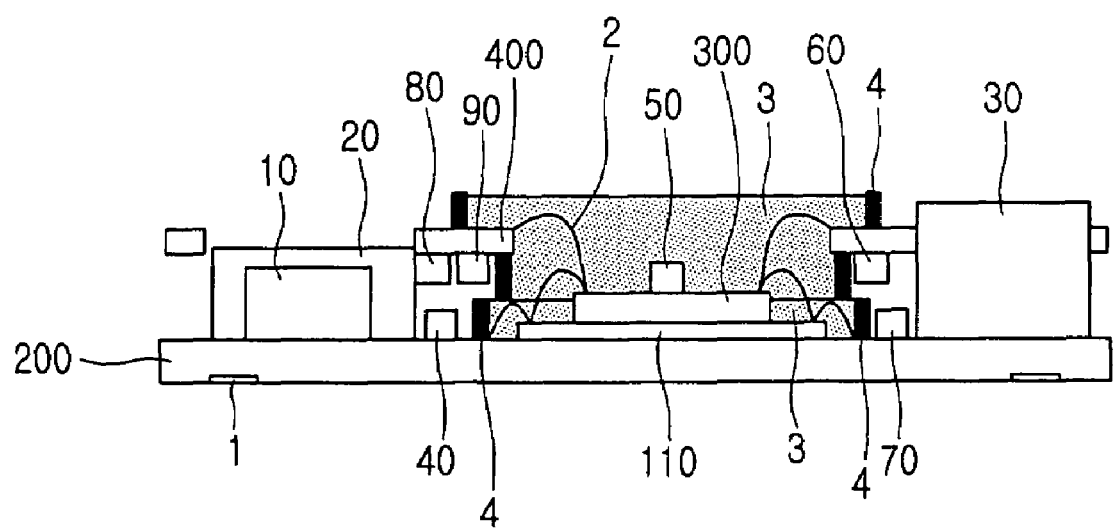
Figure 4H:
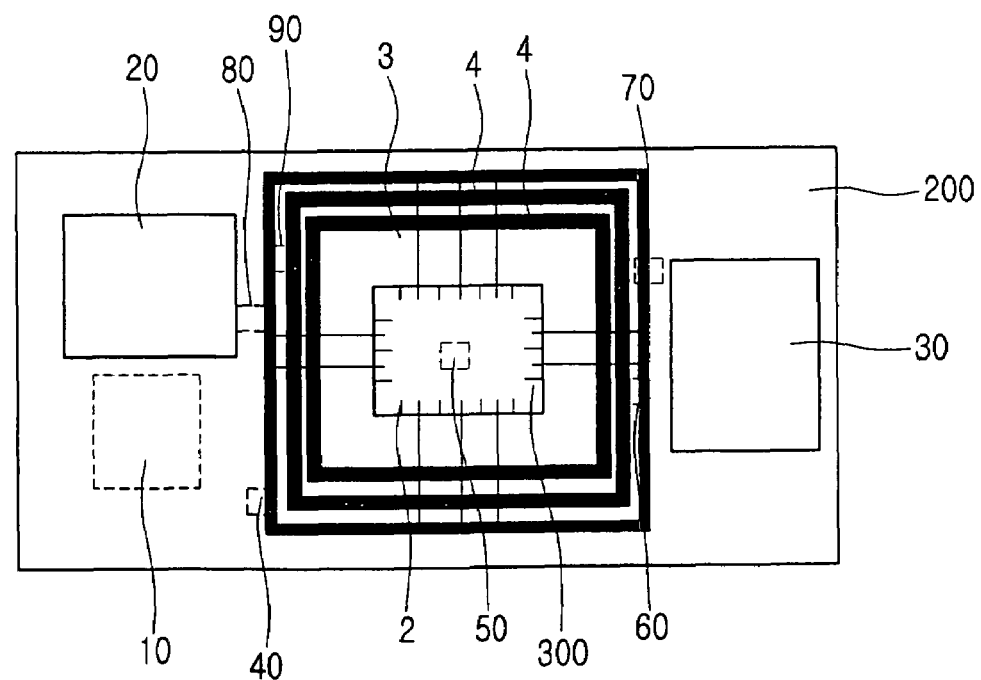

Referring to FIGS. 3h and 4h, a liquid resin is applied so as to protect the bonding wires.

As mentioned above, the semiconductor package according to the present invention is advantageous in that, in addition to the first PCB (main board), at least one PCB, e.g. second and third PCBs are additionally used and some of the devices of the package are mounted on the additional PCBs. The second and third PCBs are positioned in a space above the first PCB so that, without varying the height of the package, the area occupied by the package is substantially reduced. As a result, the package becomes light, slim, and compact.

While the invention has been shown and described with reference to certain preferred embodiments thereof, it will be understood by those skilled in the art that various changes in form and details may be made therein without departing from the spirit and scope of the invention as defined by the appended claims. For example, while the present invention has been described with regard to surface mounting on a single side, it would be recognized that the invention is also applicable to devices with double-sided surface mounting of selected components.

What is claimed is:

1. A semiconductor package comprising:
   a semiconductor chip;
   a plurality of active/passive devices;
   a first PCB acting as a main board, the semiconductor chip and devices selected from the plurality of active/passive devices being mounted on the first PCB, the devices including a highest device; and at least one sub-PCB, remaining devices of the plurality of active/passive devices being mounted on the sub-PCB, the sub-PCB having a through-hole, at least the highest device on the first PCB extending through the through-hole, so that the sub-PCB is connected to the first PCB and positioned in a space above the first PCB while overlapping the first PCB, wherein the sub-PCB comprises:

a second PCB having at least one active/passive device, the second PCB being connected to and positioned on the semiconductor chip, and a third PCB having at least one active/passive device mounted on a surface, an opening for exposing a connection portion between the semiconductor chip and the second PCB, and a through-hole suitable for accommodating the highest device on the first PCB extending through the through-hole, the third PCB being positioned so as to overlap the first PCB and the second PCB.

2. The semiconductor package as claimed in claim 1, wherein the active/passive devices mounted on the sub-PCB are selected so that, after the sub-PCB is connected to the first PCB, a final height of the sub-PCB is not larger than a thickness of the highest device on the first PCB.

3. The semiconductor package as claimed in claim 1, further comprising a bonding wire for electrically connecting the first PCB to the sub-PCB.

4. The semiconductor package as claimed in claim 1, wherein the surface of the third PCB, the active/passive device being mounted on the surface of the third PCB, is positioned so as to face a surface of the first PCB, the active/passive devices being mounted on the surface of the first PCB.

5. A method for manufacturing a semiconductor package comprising a plurality of active and passive devices, the method comprising the steps of:

attaching at least one first device selected from the plurality of active/passive devices and semiconductor chip to a first PCB, wherein the first device includes a device having a highest measurement;

attaching a second PCB to the semiconductor chip attached to the first PCB and attaching at least one second device selected from the plurality of active/passive devices to the second PCB, wherein a sum of thickness of the second device, the second PCB, and the semiconductor chip does not exceed the thickness of the first device;

preparing a third PCB having at least one third active/passive device mounted on a surface, an opening corresponding to a size and location of a connection portion between the semiconductor chip and the second PCB, and a through-hole corresponding to a size and location of at least one first device extending through the through-hole;

positioning and attaching the third PCB in a space above the first PCB so that the surface having the third device mounted thereon faces a surface having the first device mounted thereon and the connection portion is exposed through the opening, and the at least one first device is extended through the through-hole; and electrically connecting the third PCB to the first PCB.

6. The method as claimed in claim 5, wherein the third active/passive devices mounted on the third PCB are not larger than a thickness of the highest device on the first PCB.

7. The method as claimed in claim 5, further comprising the step of:

depositing a liquid molding resin between the first PCB and the third PCB.

8. The method as claimed in claim 5, wherein the step of electrically connecting comprises the step of:

forming a wire bond among the first, second and third PCB.

9. The method as claimed in claim 5, wherein the third PCB and the remaining devices mounted thereon extend no higher than the device having a highest measurement.

10. A method for manufacturing a semiconductor package comprising a plurality of active and passive devices, the method comprising the steps of:

attaching at least one first device selected from the plurality of active and passive devices and semiconductor chip to a first PCB, wherein one of the selected devices defines a maximum perpendicular measurement from the first PCB of the semiconductor package;

attaching a second PCB to the semiconductor chip attached to the first PCB and attaching at least one second device selected from the plurality of active/passive devices to the second PCB, wherein a sum of thickness of the second device, the second PCB, and the semiconductor chip does not exceed the thickness of the first device;

attaching the remaining devices of the plurality of active and passive devices to a surface of a third PCB, the third PCB having an opening corresponding to a size and location of a connection portion between the semiconductor chip and the second PCB and a through-hole suitable for extending at least the one selected device defining a maximum perpendicular measurement;

mounting the third PCB in a space above the first PCB so that at least the one selected device defining a maximum perpendicular measurement extends through the through-hole and the connection portion is exposed through the opening, wherein the third PCB and the remaining devices mounted thereon extends no higher than the at least the one selected device defining a maximum perpendicular measurement;

depositing a liquid resin between the first PCB and the third PCB; and electrically connecting the third PCB to the first PCB.

11. The method as claimed in claim 10, wherein the remaining devices are attached at least one surface of the third PCB.

12. The method as claimed in claim 10, wherein the step of electrically connecting comprises the step of:

forming a wire bond among the first, second and third PCB.

13. The method as claimed in claim 10, wherein the dimensions of the third PCB are no greater than the first PCB.

14. The method as claimed in claim 10, wherein the third PCB and the remaining devices mounted thereon extend no higher than the at least one selected device defining a maximum perpendicular measurement.

15. A method for manufacturing a semiconductor package comprising a plurality of active and passive devices, the method comprising the steps of:

attaching at least one first device selected from the plurality of active and passive devices and semiconductor chip to a first PCB, wherein one of the selected devices defines a maximum perpendicular measurement from the first PCB of the semiconductor package;

attaching a second PCB to the semiconductor chip attached to the first PCB and attaching at least one second device selected from the plurality of active/passive devices to the second PCB, wherein a sum of thickness of the second device, the second PCB, and the semiconductor chip does not exceed the thickness of the first device;

attaching the remaining devices of the plurality of active and passive devices to a surface of a third PCB, the third PCB having an opening corresponding to a size and location of a connection portion between the semiconductor chip and the second PCB and a through-hole suitable for extending at least the one selected device defining a maximum perpendicular measurement;

mounting the third PCB in a space above the first PCB so that at least the one selected device defining a maximum perpendicular measurement extends through the through-hole and the connection portion is exposed through the opening, wherein the third PCB and the remaining devices mounted thereon extends no higher than the at least the one selected device defining a maximum perpendicular measurement;

electrically connecting the third PCB to the first PCB, wherein the step of mounting causing selected one of devices on the first PCB to face selected ones of the remaining devices on the third PCB.

* * * * *